United States Patent
Yang et al.

(10) Patent No.: US 8,962,479 B2
(45) Date of Patent: Feb. 24, 2015

(54) INTERCONNECT STRUCTURES CONTAINING NITRIDED METALLIC RESIDUES

(71) Applicant: International Business Machines Corporation, Armonk, NY (US)

(72) Inventors: Chih-Chao Yang, Glenmont, NY (US); Stephan A. Cohen, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 13/891,869

(22) Filed: May 10, 2013

(65) Prior Publication Data
US 2014/0332964 A1 Nov. 13, 2014

(51) Int. Cl.
*H01L 21/44* (2006.01)
*H01L 23/522* (2006.01)
*H01L 21/768* (2006.01)
*H01L 23/532* (2006.01)

(52) U.S. Cl.
CPC ............ *H01L 23/522* (2013.01); *H01L 21/768* (2013.01); *H01L 23/53233* (2013.01); *H01L 21/76883* (2013.01); *H01L 23/532* (2013.01); *H01L 23/5226* (2013.01)
USPC .... 438/659; 438/622; 438/642; 257/E21.582; 257/E23.145; 257/E23.155

(58) Field of Classification Search
CPC ................... H01L 21/76814; H01L 21/76883; H01L 23/5226; H01L 23/532
USPC .......... 438/641, 642, 622, 659; 257/767, 752, 257/773, E23.145, E23.155, E21.582
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,215,189 B1 | 4/2001 | Toyoda et al. | |
| 6,323,554 B1 | 11/2001 | Joshi et al. | |
| 6,342,733 B1 | 1/2002 | Hu et al. | |
| 6,706,625 B1 | 3/2004 | Sudijono et al. | |
| 7,157,798 B1 | 1/2007 | Fair et al. | |
| 8,133,810 B2 * | 3/2012 | Yang et al. | 438/653 |
| 2004/0113279 A1 | 6/2004 | Chen et al. | |
| 2008/0116582 A1* | 5/2008 | Hsu et al. | 257/774 |
| 2008/0120580 A1* | 5/2008 | Hsu et al. | 716/5 |
| 2008/0197499 A1* | 8/2008 | Yang et al. | 257/758 |

(Continued)

OTHER PUBLICATIONS

Office Action dated Oct. 7, 2014 received in U.S. Appl. No. 14/028,068.

*Primary Examiner* — Joseph C Nicely
(74) *Attorney, Agent, or Firm* — Scully, Scott, Murphy & Presser, P.C.; Louis J. Percello, Esq.

(57) ABSTRACT

A metal cap is formed on an exposed upper surface of a conductive structure that is embedded within an interconnect dielectric material. During the formation of the metal cap, metallic residues simultaneously form on an exposed upper surface of the interconnect dielectric material. A thermal nitridization process or plasma nitridation process is then performed which partially or completely converts the metallic residues into nitrided metallic residues. During the nitridization process, a surface region of the interconnect dielectric material and a surface region of the metal cap also become nitrided.

10 Claims, 3 Drawing Sheets

(56) References Cited

U.S. PATENT DOCUMENTS

| | | | |
|---|---|---|---|
| 2008/0197500 A1* | 8/2008 | Yang et al. | 257/758 |
| 2010/0176514 A1* | 7/2010 | Yang et al. | 257/761 |
| 2010/0181677 A1* | 7/2010 | Edelstein et al. | 257/773 |
| 2011/0108990 A1* | 5/2011 | Bonilla et al. | 257/761 |
| 2012/0104610 A1* | 5/2012 | Filippi et al. | 257/750 |
| 2012/0329271 A1* | 12/2012 | Yang et al. | 438/650 |
| 2014/0099789 A1 | 4/2014 | Kolics | |
| 2014/0203436 A1* | 7/2014 | Filippi et al. | 257/751 |
| 2014/0264920 A1 | 9/2014 | Yang et al. | |

* cited by examiner

INTERCONNECT STRUCTURES CONTAINING NITRIDED METALLIC RESIDUES

BACKGROUND

The present application relates to a semiconductor structure and a method of forming the same. More particularly, the present application relates to an interconnect structure having improved reliability and a method of forming the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure, which may also be referred to as an interconnect structure, typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

SUMMARY

A metal cap, which is used to reduce electromigration, is formed on an exposed upper surface of a conductive structure that is embedded within an interconnect dielectric material. During the formation of the metal cap, metallic residues simultaneously form on an exposed upper surface of the interconnect dielectric material. A thermal nitridization process or plasma nitridation process is then performed which partially or completely converts the metallic residues into nitrided metallic residues. During the nitridization process, a surface region of the interconnect dielectric material and a surface region of the metal cap also become nitrided. As a result of performing one of the nitridation processes, the resultant interconnect structure has lower current leakage between adjacent metal lines and enhanced reliability as compared to an equivalent interconnect structure in which nitridation is not performed.

In one aspect of the present application, a method of forming an interconnect structure is provided. In accordance with this aspect of the present application, the method includes providing at least one conductive structure embedded within an interconnect dielectric material, wherein the at least one conductive structure has an upper surface that is coplanar with an upper surface of the interconnect dielectric material. A metal cap is then formed on the exposed upper surface of the at least one conductive structure, and during the formation of the metal cap, metallic residues are simultaneously formed on the upper surface of the interconnect dielectric material. A nitridation process is then performed that converts the metallic residues into nitrided metallic residues, and forms a nitrided interconnect dielectric material surface region on a remaining portion of the interconnect dielectric material and a nitrided metal cap surface region on a remaining portion of the metal cap.

In another aspect of the present application, an interconnect structure is provided that has high electromigration resistance, low current leakage and enhanced reliability. Specifically, the interconnect structure of the present application includes at least one conductive structure embedded within an interconnect dielectric material. The interconnect dielectric material includes a nitrided interconnect dielectric material surface region located at an exposed surface thereof. The interconnect structure of the present application further includes a metal cap stack comprising, from bottom to top, a metal cap portion and a nitrided metal cap surface region located on an upper surface of the at least one conductive structure. The interconnect structure of the present application even further includes nitrided metallic residues on a surface of the nitrided interconnect dielectric material surface region.

DETAILED DESCRIPTION

Figure 1:
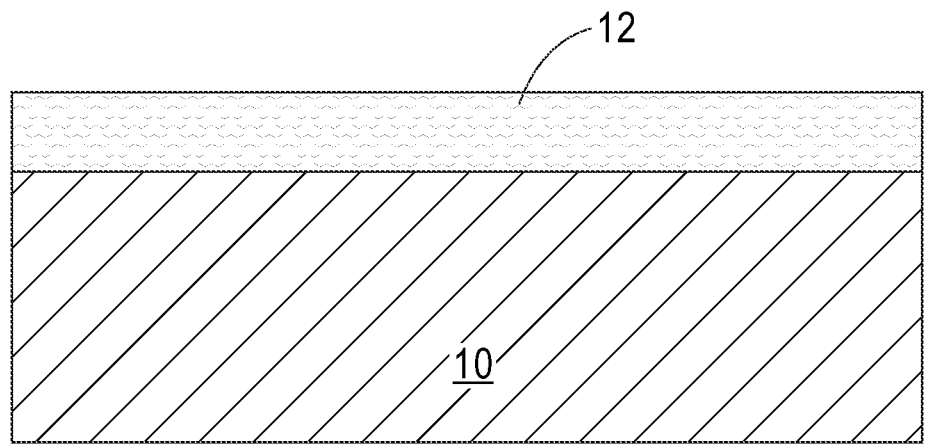
FIG. 1 is a pictorial representation (through a cross sectional view) illustrating a structure including a blanket layer of a sacrificial dielectric material located on an exposed upper surface of an interconnect dielectric material that can be employed in one embodiment of the present application.

The present application, which provides an interconnect structure and a method of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

Referring first to FIG. 1, there is illustrated a structure including a blanket layer of a sacrificial dielectric material 12 located on an exposed upper surface of an interconnect dielectric material 10 that can be employed in one embodiment of the present application. The term "blanket layer" as used throughout the present application denotes that a material layer is formed entirely on an exposed surface of an underlying material layer.

Although not shown, the structure shown in FIG. 1 is typically located upon a substrate. The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a lower interconnect level of a multilayered interconnect structure.

The interconnect dielectric material 10 that can be employed in the present application may include any inter-level or intralevel dielectric material including inorganic dielectric materials, organic dielectric materials, or combinations thereof. The interconnect dielectric material 10 may be porous, non-porous or contain regions and/or surfaces that are porous and other regions and/or surfaces that may be non-porous. Some examples of suitable dielectrics that can be used as the interconnect dielectric material 10 may include, but are not limited to, silicon oxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present application, the interconnect dielectric material 10 has a dielectric constant that is about 3.0 or less, with a dielectric constant of about 2.8 or less being even more typical. All dielectric constants mentioned herein are relative to a vacuum, unless otherwise noted. Dielectric materials that have dielectric constants of about 3.0 or less generally have a lower parasitic cross talk as compared with dielectric materials that have a higher dielectric constant than 4.0. The thickness of the interconnect dielectric material 10 may vary depending upon the dielectric material used as well as the exact number of dielectric layers within the interconnect dielectric material 10. In one embodiment, and by way of an example, the interconnect dielectric material 10 may have a thickness from 50 nm to 1000 nm. Other thicknesses that are lesser than or greater than the aforementioned thickness range may also be employed for the interconnect dielectric material 10.

The interconnect dielectric material 10 can be formed utilizing a deposition process. Examples of suitable deposition process that can be used in forming the interconnect dielectric material 10 include, but are not limited to, chemical vapor deposition (CVD), plasma enhanced chemical vapor deposition (PECVD), evaporation, chemical solution deposition and spin-on coating.

After forming the interconnect dielectric material 10, the blanket layer of sacrificial dielectric material 12 is formed on an exposed surface of interconnect dielectric material 10. The blanket layer of sacrificial dielectric material 12 may comprise an oxide, nitride, oxynitride or multilayers thereof (e.g., a sacrificial material stack composed of a pad oxide and a pad nitride). In some embodiments, the blanket layer of sacrificial dielectric material 12 may be composed of a semiconductor oxide, a semiconductor nitride and/or a semiconductor oxynitride. In one example, the blanket layer of sacrificial dielectric material 12 may be composed of silicon oxide and/or silicon nitride.

In some embodiments, the blanket layer of sacrificial dielectric material 12 may be formed by a deposition process. Examples of deposition process that may be used in forming the blanket layer of sacrificial dielectric material 12 include, but are not limited to, CVD, PECVD, evaporation, chemical solution deposition, physical vapor deposition (PVD) and atomic layer deposition. In other embodiments, the blanket layer of sacrificial dielectric material 12 can be formed by a thermal process such as, for example, a thermal oxidation, a thermal nitridation and/or a thermal oxynitridation process. In yet other embodiments, the blanket layer of sacrificial dielectric material 12 can be formed utilizing a combination of deposition and thermal processes. That is, a thermal oxidation process may be used to form a sacrificial oxide material, followed by CVD to form a sacrificial nitride material.

The thickness of the blanket layer of sacrificial dielectric material 12 may vary depending on the number of materials within the blanket layer of sacrificial dielectric material 12 itself as well as the technique that was used in forming the same. Typically, the blanket layer of sacrificial dielectric material 12 has a thickness from 10 nm to 80 nm. Other thicknesses that are lesser than or greater than the aforementioned thickness range may also be used for the blanket layer of sacrificial dielectric material 12.

Figure 2:
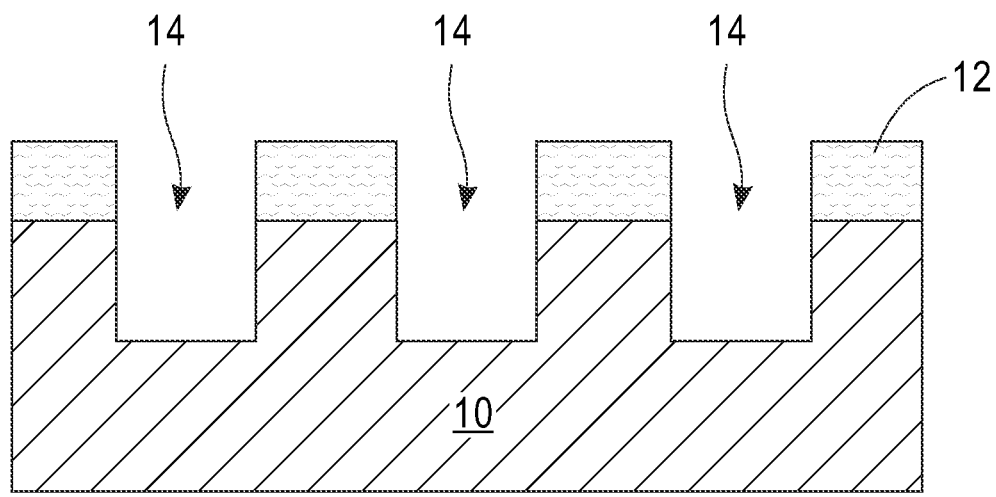
FIG. 2 is a pictorial representation (through a cross sectional view) illustrating the structure of FIG. 1 after forming at least one opening through the blanket layer of sacrificial dielectric material and into at least a portion of the interconnect dielectric material.

Referring now to FIG. 2, there is illustrated the structure of FIG. 1 after forming at least one opening 14 through the blanket layer of sacrificial dielectric material 12 and into at least a portion of the interconnect dielectric material 10. In some embodiments (not shown), the at least one opening 14 can extend entirely through the interconnect dielectric material 10. In other embodiments, and as illustrated in FIG. 2, the at least one opening 14 can extend partially through the interconnect dielectric material 10.

The at least one opening 14 may include a via opening, a line opening, a combined via and line opening, or any combination thereof. In the drawings, three via openings are shown by way of a non-limiting example. In some embodiments, a single opening can be formed. In other embodiments, a plurality (i.e., greater than 1) of openings can be formed. In some embodiments of the present application, each of the openings 14 may extend a same depth into the interconnect dielectric material 10. In other embodiments, a first set of openings may extend to a first depth into the interconnect dielectric material 10, and a second set of openings may extend to a second depth into the interconnect dielectric material 10, wherein the second depth is different (less than or greater than) the first depth. Other depth scenarios are also possible and thus the present application is not limited to any specific depth or depths that the openings 14 can extend into the interconnect dielectric material 10.

The at least one opening 14 can be formed by lithography and etching. The lithographic step includes forming a photoresist (organic, inorganic or hybrid) atop the blanket layer of sacrificial dielectric material 12 by a deposition process. Examples of deposition processes that can be used in forming the photoresist include, for example, CVD, PECVD and spin-on coating. Following formation of the photoresist, the photoresist can be exposed to a desired pattern of radiation. In one example, a trench pattern of radiation can be used. In another embodiment, a line pattern of radiation can be used. Next, the exposed photoresist can be developed utilizing a resist development process well known to those skilled in the art.

After the development step, an etching step is performed to transfer the pattern from the patterned photoresist into the blanket layer of sacrificial dielectric material 12 and thereafter into the interconnect dielectric material 10. The patterned photoresist is typically removed from the surface of the structure after transferring the pattern into the blanket layer of sacrificial dielectric material 12 utilizing a conventional resist stripping process such as, for example, ashing. The remaining sacrificial dielectric material is then used as an etch mask during the subsequent transferring of the pattern into the interconnect dielectric material 10. The etching step used in forming the at least one opening 14 may include a dry etching process (including reactive ion etching, ion beam etching, plasma etching or laser ablation), a wet chemical etching process or any combination thereof. In one example, a reactive ion etching is used to form the at least one opening 14. In some embodiments and for forming single damascene structures, a single lithographic and etching sequence is performed. In other embodiments and for fabricating dual damascene structures, a first lithographic and etching sequence is performed, and then a second lithographic and etching sequence is performed.

Figure 3:
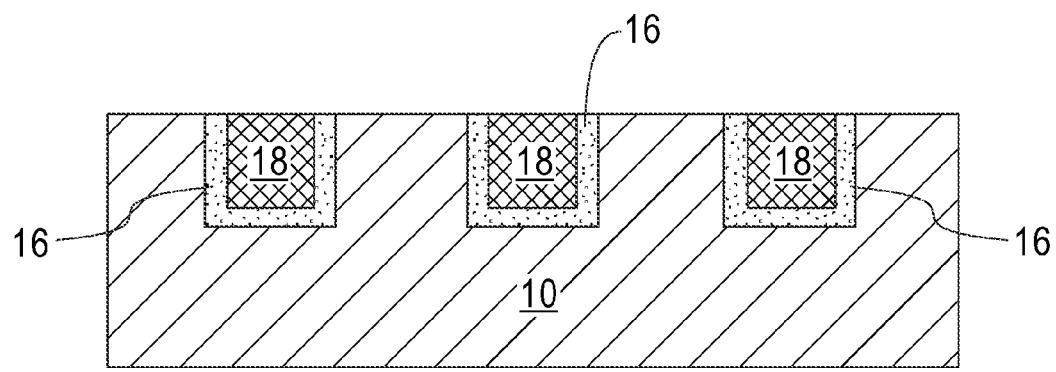
FIG. 3 is a pictorial representation (through a cross sectional view) illustrating the structure of FIG. 2 after formation of a diffusion barrier liner, and a conductive structure within each opening, and removing remaining portions of the blanket layer of sacrificial dielectric material.

Referring now to FIG. 3, there is illustrated the structure of FIG. 2 after formation of a diffusion barrier liner 16 and a conductive structure 18 within each opening 14, and removing remaining portions of the blanket layer of sacrificial dielectric material 12 from atop the interconnect dielectric material 10. Notably, FIG. 3 shows a planar structure including conductive structures 18 embedded within interconnect dielectric material 10, wherein diffusion barrier liner 16 is located between portions of the interconnect dielectric material 10 and portions of each conductive structure 18.

As shown in FIG. 3, the upper surface of each conductive structure 18 embedded within the interconnect dielectric material 10 is coplanar with an upper surface of the interconnect dielectric material 10. The upper surface of each conductive structure 18, and the upper surface of the interconnect dielectric material 10 are also coplanar with upper surfaces of the diffusion barrier liner 16. In some embodiments, and as shown in the drawings of the present application, the diffusion barrier liner 16 is U-shaped. The diffusion barrier liner 16 is a contiguous layer that is present within each opening 14 that is formed within the interconnect dielectric material 10.

The structure shown in FIG. 3 is provided by first forming a diffusion barrier material on the exposed surfaces of the remaining portions of the blanket layer of sacrificial dielectric material 12 and on exposed surfaces of the interconnect dielectric material 10 within each opening 14. Next, a conductive material is formed on the exposed surfaces of the diffusion barrier material. A planarization process such as, for example, chemical mechanical polishing and/or grinding can be used to remove portions of the diffusion barrier material, the conductive material and remaining portions of the blanket layer of sacrificial dielectric material 12 from the upper surface of the interconnect dielectric material 10. The remaining portions of diffusion barrier material can be referred to herein as diffusion barrier liner 16, while the remaining portions of the conductive material can be referred to herein as conductive structure 18.

The diffusion barrier material that can be employed in forming the diffusion barrier liner 16 may be composed of Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier material used in forming the diffusion barrier liner 16 may vary depending on the deposition process used as well as the material employed. In one embodiment of the present application, the diffusion barrier material that forms the diffusion barrier liner 16 has a thickness from 4 nm to 40 nm. Other thicknesses that are lesser than or greater than the aforementioned thickness range can also be employed for the diffusion barrier material. The diffusion barrier material that forms the diffusion barrier liner 16 may be formed by a deposition process. Examples of deposition processes that can be used in forming the diffusion barrier material include, but are not limited to, CVD, PECVD, PVD, sputtering and plating.

The conductive material used in forming the conductive structure 18 includes, for example, polySi, a conductive metal, an alloy comprising at least two conductive metals, a conductive metal silicide or combinations thereof. In one embodiment of the present application, the conductive material that is used in forming the conductive structure 18 is a conductive metal or conductive metal alloy. In some examples, the conductive metal used in forming the conductive structure 18 includes Cu, W, Al, or alloys thereof. In one particular embodiment of the present application, Cu or a Cu alloy (such as AlCu) is used as the conductive material that forms the conductive structure 18.

The conductive material that is used in forming the conductive structure 18 can be formed utilizing a deposition process. Deposition processes that can be used in forming the conductive material include, but are not limited to, CVD, PECVD, PVD, sputtering, plating, chemical solution deposition and electroless plating.

Figure 4:
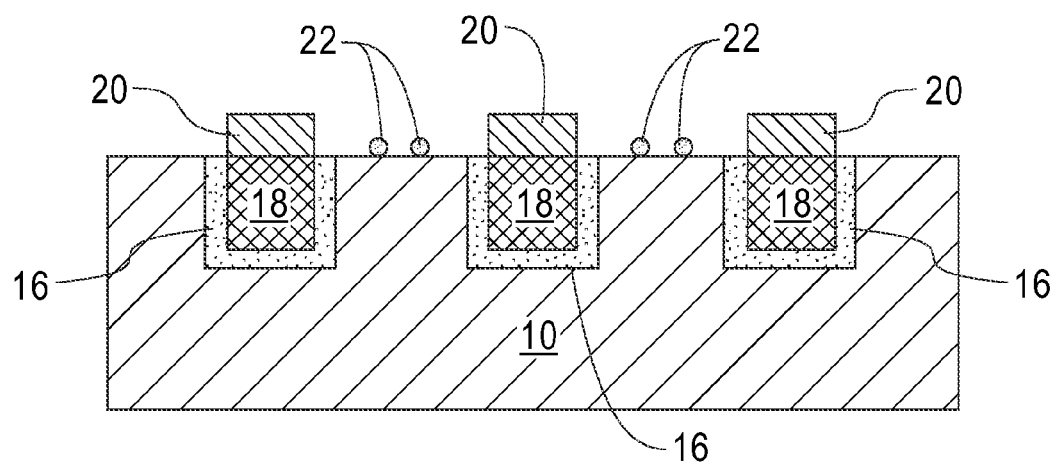
FIG. 4 is a pictorial representation (through a cross sectional view) illustrating the structure of FIG. 3 after formation of a metal cap on an exposed surface of the conductive structure and, optionally, on exposed surfaces of the diffusion barrier liner, and the concurrent formation of metallic residues on the exposed surface of the interconnect dielectric material.

Referring now to FIG. 4, there is illustrated the structure of FIG. 3 after formation of a metal cap 20 on an exposed upper surface of each conductive structure 18 and, optionally, on exposed surfaces of the diffusion barrier liner 16, and the concurrent formation of metallic residues 22 on the exposed upper surface of the interconnect dielectric material 10.

The term "metallic residues" is used throughout the present application to denote fragments of metal material that is used in providing the metal cap 20 which form on surface of the interconnect dielectric material 10 during the formation of metal cap 20. The metallic residues 22 are conductive, and if the metallic residues 22 remain on the exposed upper surface of the interconnect dielectric material 10 in the same form as which they are formed, the resultant interconnect structure could exhibit current leakage between adjacent metal lines. In some cases, and if the metallic residues 22 remain on the exposed upper surface of the interconnect dielectric material 10 in the same form as which they are formed, the resultant interconnect structure might be unreliable.

In some embodiments, the metal cap 20 is formed only on the exposed surface of the conductive structure 18. In other embodiments, the metal cap 20 is formed on exposed surfaces of both the conductive structure 18 and the diffusion barrier liner 16. In the drawings, the metal cap 20 is formed only atop the upper surface of each conductive structure 18.

The metal cap 20 that can be employed in the present application includes any metal that is more resistant to corrosion or oxidation than the underlying conductive structure 18. In one embodiment of the present application, the metal cap 20 includes Ru, Ir, Rh, Mn Pt, Co, W or alloys thereof. In another embodiment, the metal cap 20 may comprise a Co(W, P, B) alloy. In some embodiments, the metal cap 20 may comprise a single layer of metal. In other embodiments, the metal cap 20 may comprise a plurality of metal layers. In some cases, Co is selected as the material for the metal cap 20.

The thickness of the metal cap 20 may vary depending on the type of metal used in forming metal cap 20, the deposition technique and conditions used as well as the number of metals used in providing metal cap 20. In one embodiment, the metal cap 20 has a thickness from 1 Å to 100 Å, although other thicknesses that are lesser than or greater than the aforementioned thickness range can be used.

The metal cap 20 can be formed by a deposition process. Examples of deposition processes that can be used in forming the metal cap 20 include, but are not limited to, CVD, PECVD, ALD and electroless deposition. In some embodiments, the deposition of the metal cap 20 is performed at a temperature of greater than 200° C. to a temperature of 400° C.

In one embodiment of the present application, the metal cap 20 can be formed utilizing a low temperature chemical deposition process including, for example, CVD, PECVD, low pressure (i.e., a pressure of 20 ton or less) CVD, ALD or electroless deposition. By "low temperature", it is meant a deposition temperature of from 75° C. up to, and including, 200° C. In some embodiments, the low temperature deposition conditions are selected to provide a deposition rate of the metal cap 20 onto the conductive structure 18 that is from 0.2 Å/sec to 0.8 Å/sec. In some embodiments of the present application, the selective deposition of the metal cap 20 on to only the conductive structure 18 is enhanced by utilizing a low k dielectric material (i.e., k about 3.0 or less) as interconnect dielectric material 10 in conjunction with a low temperature chemical deposition process as discussed above.

Figure 5:
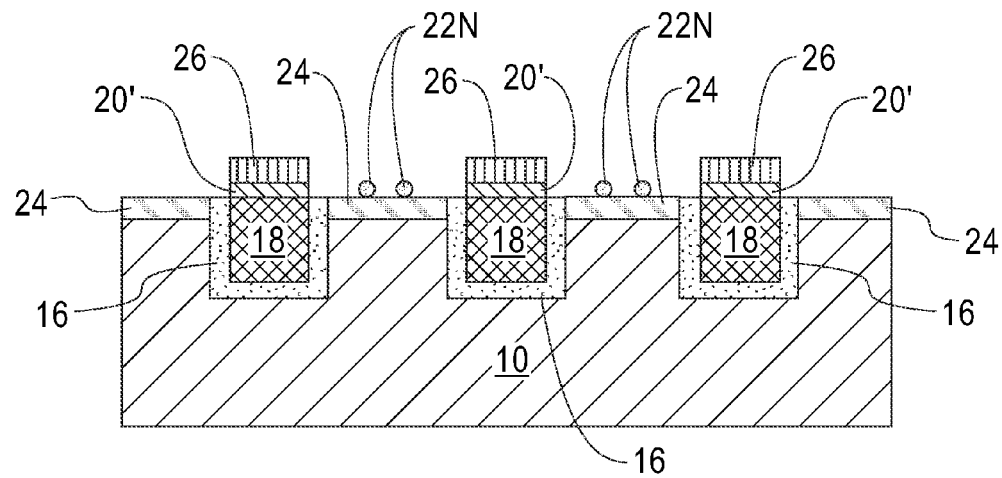
FIG. 5 is a pictorial representation (through a cross sectional view) illustrating the structure of FIG. 4 after performing a nitridation process.

Referring now to FIG. 5, there is illustrated the structure of FIG. 4 after performing a nitridation process. The nitridation process can also be referred to herein as a post metal cap treatment. The nitridation process of the present application nitridizes, at least partially or entirely, the metallic residues 22 that are present on the exposed surface of the interconnect dielectric material 10. That is, the nitridation process partially coverts or entirely converts the metallic residues located on the upper surface of the interconnect dielectric material 10 into nitrided metallic residues which are less conductive than their non-nitrided metallic residue counterparts. The nitrided metallic residues are labeled as element 22N in FIG. 5. In some embodiments, an upper portion of the diffusion barrier liner 16 may be nitrided as well during this step of the present application.

In addition to nitridizing the metallic residues 22, the nitridation process of the present application also nitridizes any exposed surface of the interconnect dielectric material 10 forming a nitrided interconnect dielectric material surface region 24 on a remaining portion of the interconnect dielectric material 10, and any exposed surface of the metal cap forming a nitrided metal cap surface region 26 on a remaining portion of the metal cap 20. The remaining portion metal cap 20 can be referred to herein as metal cap portion 20'. Taken together, the metal cap portion 20' and the nitrided metal cap surface region 26 can be referred to as a metal cap stack.

In accordance with the preset application, the nitrided interconnect dielectric material surface region 24 has a higher content of nitride (i.e., nitrogen) than the remaining portion of the interconnect dielectric material 10. Likewise, the nitrided metal cap surface region 26 has a higher nitride (i.e., nitrogen) content than the remaining portion of the metal cap 20.

The term "nitrided interconnect dielectric material surface region" is used in the present application to denote a portion of the interconnect dielectric material in which nitride exposure was made. The nitrided interconnect dielectric material surface region includes a nitrided dielectric material that has a higher content of nitride as compared to remaining portions of the interconnect dielectric material 10 which were not subjected to the nitride exposure.

The term "nitrided metal cap surface region" is used in the present application to denote a portion of the metal cap material in which nitride exposure was made. The nitrided metal cap surface region includes a nitrided metal cap material that has a higher content of nitride as compared to remaining portions of the metal cap 20 which were not subjected to the nitride exposure.

In accordance with the present application, an upper surface of the nitrided interconnect dielectric material surface region 24 is coplanar with an upper surface of each conductive structure 18.

In one embodiment of the present application, the nitridation process can be performed utilizing a thermal nitridation process. Thermal nitridation includes heating the structure shown in FIG. 4 in the presence of a nitrogen-containing source. The heating should be performed such that oxidation of metallic residue is avoided. The heating may by performed utilizing any energy source including, for example, a heating element or a lamp. In some embodiments of the present application, the heating can performed at a temperature from 80° C. to 400° C. In another embodiment, the heating can be performed at a temperature from 150° C. to 300° C. In some embodiments of the present application, the heating in the presence of a nitrogen-containing source can be performed at a single temperature. In another embodiment, the heating in the presence of a nitrogen-containing source can be performed a various temperatures using various ramp-up rates and/or soak times.

The nitrogen-containing source that can be used during thermal nitridation includes, but is not limited to, $N_2$, NO, $N_2O$, $NH_3$, $N_2H_2$ and mixtures thereof. Prior to thermal nitridation, the nitrogen-containing source can be in any form. However, during the thermal nitridation process the nitrogen-containing source is in the form of a gas or vapor. In some embodiments, the nitrogen-containing source can be used neat. In another embodiment of the present application, the nitrogen-containing source can be used in conjunction with an inert ambient such as, for example, He, Ar, Ne and mixtures thereof. In such an embodiment, the nitrogen-containing source and the inert ambient can be admixed prior to being used during thermal nitridation. In yet another embodiment, the nitrogen-containing source and the inert gas can be introduced as separate components into a reactor and then admixed within the reactor itself prior contacting the surface of the structure shown in FIG. 4. When a nitrogen-containing source/inert ambient mixture is employed, and in one embodiment, the concentration of nitrogen-containing source within the mixture is from 10% to 90%, the remainder up to 100% is the content of the inert ambient. In another embodiment, the concentration of nitrogen-containing source within the mixture is from 40% to 70%, the remainder up to 100% is the content of the inert ambient.

In another embodiment of the present application, the nitridation process can be performed utilizing a plasma nitridation process. Plasma nitridation includes introducing a nitrogen-containing plasma to the structure shown in FIG. 4. The nitrogen-containing plasma can be generated by introducing a nitrogen-containing source into a reactor that can generate the nitrogen-containing plasma. In some embodiments of the present application, an RF or microwave power source can be used to generate a nitrogen-containing plasma within a reactor.

The nitrogen-containing source that can be used in providing the nitrogen-containing plasma includes, but is not limited to, $N_2$, NO, $N_2O$, $NH_3$, $N_2H_2$ and mixtures thereof. In some embodiments, only a nitrogen-containing source is used in providing the nitrogen-containing plasma. In other embodiments of the present application, the nitrogen-containing plasma can be generated from a mixture of a nitrogen-containing source and an inert ambient such as, for example, He, Ar, Ne and mixtures thereof. In such an embodiment, the nitrogen-containing source and the inert ambient can be admixed prior to being introduced into a reactor that generates a plasma. In yet another embodiment, the nitrogen-containing source and the inert gas can be introduced as separate components into a reactor that generates a plasma and then admixed within the reactor itself prior to generating the plasma. When a nitrogen-containing source/inert gas mixture is employed, and in one embodiment, the concentration of nitrogen-containing source within the mixture is from 10% to 90%, the remainder up to 100% is the content of the inert ambient. In another embodiment, the concentration of nitrogen-containing source within the mixture is from 40% to 70%, the remainder up to 100% is the content of the inert ambient.

Specifically, FIG. 5 illustrates an exemplary interconnect structure of the present application. The illustrated interconnect structure of FIG. 5 includes at least one conductive structure 18 embedded within an interconnect dielectric material 10. The interconnect dielectric material 10 includes a nitrided interconnect dielectric material surface region 24 located at an exposed surface thereof. The interconnect structure of the present application further includes a metal cap stack comprising, from bottom to top, a metal cap portion 20' and a nitrided nitrided metal cap surface region 26 located on an upper surface of the at least one conductive structure 18. The interconnect structure of the present application even further includes nitrided metallic residues 22N located on a surface of the nitrided interconnect dielectric material surface region 24.

Figures 6A, 6B:
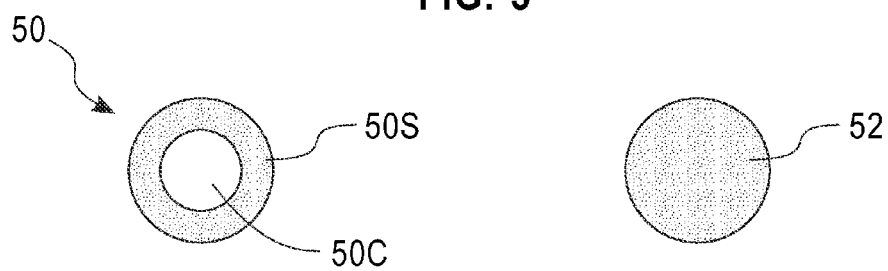
FIG. 6A is a pictorial representation illustrating a partially nitrided metallic residue that can be formed in one embodiment of the present application.
FIG. 6B is a pictorial representation illustrating a completely nitrided metallic residue that can be formed in one embodiment of the present application.

Depending on the conditions of the nitridation process, the metallic residues 22 can be partially nitrided, completely nitride, or a first set can be partially nitrided and a second set can be completely nitrided. Reference is now made to FIGS. 6A and 6B which illustrate some exemplary embodiments of the present application. Notably FIG. 6A illustrates a partially nitrided metallic residue that can be formed in one embodiment of the present application, while FIG. 6B illustrates a completely nitrided metallic residue that can be formed in one embodiment of the present application. In FIG. 6A, the partially nitrided metallic residue 50 includes a core 50C containing metallic residue, and shell 50S that contains nitrided metal. That is, the nitrided metallic residues shown in FIG. 6A comprises a nitrided metallic shell surrounding a non-nitrided metallic core. In FIG. 6B, the entirety of the nitrided metallic residue 52 contains nitrided metal.

Figure 7:
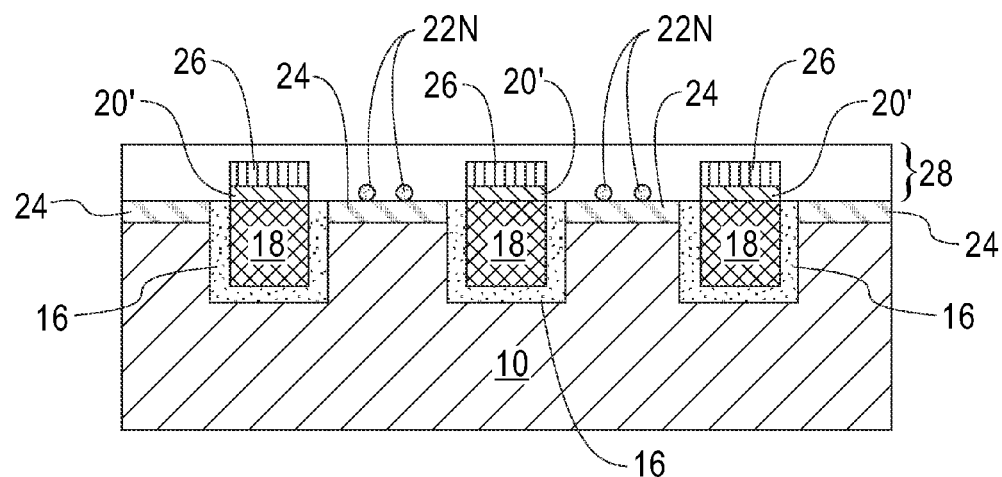
FIG. 7 is a pictorial representation (through a cross sectional view) illustrating the structure of FIG. 5 after forming a dielectric capping layer on exposed surfaces of the interconnect structure.

Referring now to FIG. 7, there is illustrated the structure of FIG. 5 after forming a dielectric capping layer 28 on exposed surfaces of the interconnect structure. Specifically, and as shown in FIG. 7, the dielectric capping layer has a bottom surface that contacts an exposed surface of the nitrided interconnect dielectric material surface region 24, nitrided metal cap surface region 26, if exposed, a surface of each nitrided metallic residue 22N, and also the diffusion barrier liner 16.

The dielectric capping layer 28 comprises a dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 28 may vary depending on the technique used to form the same as well as the material make-up of the layer. In one embodiment, and by way of n example, the dielectric capping layer 28 has a thickness from 15 nm to 100 nm. Other thicknesses that are lesser than or greater than the aforementioned thickness range may also be employed for the dielectric capping layer 28. The dielectric capping layer 28 can be formed by a deposition process. Examples of deposition processes that can be used in forming the dielectric capping layer 28 include, but are not limited to, CVD, PECVD, evaporation, spin-on coating, chemical solution deposition and PVD.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor interconnect structure comprising:
providing at least one conductive structure embedded within an interconnect dielectric material, wherein said at least one conductive structure has an upper surface that is coplanar with an upper surface of the interconnect dielectric material;
forming a metal cap on the exposed upper surface of the at least one conductive structure, while simultaneously forming metallic residues on the upper surface of the interconnect dielectric material;
performing a nitridation process that converts the metallic residues into nitrided metallic residues, and forms a nitrided interconnect dielectric material surface region on a remaining portion of the interconnect dielectric material and a nitrided metal cap surface region on a remaining portion of the metal cap; and
forming a dielectric capping layer on the nitrided interconnect dielectric material surface region and on the nitrided metallic residues after performing the nitridation process.

2. The method of claim 1, wherein a U-shaped diffusion barrier liner is present between said at least one conductive structure and portions of said interconnect dielectric material.

3. The method of claim 1, wherein said forming the metal cap comprises a deposition process performed at a temperature from 75° C. up to, and including, 200° C.

4. The method of claim 3, wherein said deposition process comprises chemical vapor deposition, plasma enhanced chemical vapor deposition, low pressure chemical vapor deposition, atomic layer deposition or electroless deposition.

5. The method of claim 1, wherein said nitridation process comprises a thermal nitridation process.

6. The method of claim 5, wherein said thermal nitridation process is performed at a temperature from 80° C. to 400° C. in the presence of a nitrogen-containing source.

7. The method of claim 1, wherein said nitridation process comprises a plasma nitridation process.

8. The method of claim 7, wherein said plasma nitridation process includes generating a plasma from a nitrogen-containing source.

9. The method of claim 1, wherein each nitrided metallic residue is partially nitrided during said nitridation process.

10. The method of claim 1, wherein each nitrided metallic residue is completely nitrided during said nitridation process.

* * * * *